United States Patent
Chang et al.

(10) Patent No.: US 10,204,660 B2
(45) Date of Patent: *Feb. 12, 2019

(54) MEMORY DEVICE WITH STRAP CELLS

(71) Applicant: TAIWAN SEMICONDUCTOR MANUFACTURING CO., LTD., Hsinchu (TW)

(72) Inventors: Jonathan Tsung-Yung Chang, Hsinchu (TW); Cheng-Hung Lee, Hsinchu County (TW); Chi-Ting Cheng, Taichung (TW); Hung-Jen Liao, Hsinchu (TW); Jhon-Jhy Liaw, Hsinchu County (TW); Yen-Huei Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,332

(22) Filed: Dec. 4, 2017

(65) Prior Publication Data

US 2018/0096710 A1 Apr. 5, 2018

Related U.S. Application Data

(63) Continuation of application No. 15/438,567, filed on Feb. 21, 2017, now Pat. No. 9,842,627, which is a (Continued)

(51) Int. Cl.
| | |
|---|---|
| *G11C 5/02* | (2006.01) |
| *G11C 5/14* | (2006.01) |
| *G11C 7/10* | (2006.01) |
| *G11C 7/12* | (2006.01) |
| *G11C 11/417* | (2006.01) |
| *G11C 7/22* | (2006.01) |

(52) U.S. Cl.
CPC .............. *G11C 5/02* (2013.01); *G11C 5/025* (2013.01); *G11C 5/14* (2013.01); *G11C 7/10* (2013.01); *G11C 7/1069* (2013.01); *G11C 7/1096* (2013.01); *G11C 7/12* (2013.01); *G11C 7/22* (2013.01); *G11C 11/417* (2013.01)

(58) Field of Classification Search
CPC .............. G11C 5/02; G11C 5/14; G11C 7/10
USPC ................ 365/230.03, 189.17, 210.11
See application file for complete search history.

(56) References Cited

U.S. PATENT DOCUMENTS

| | | | |
|---|---|---|---|
| 5,966,315 A | 10/1999 | Muller et al. | |
| 6,498,758 B1 * | 12/2002 | Pomar | G11C 7/18 365/189.04 |

(Continued)

FOREIGN PATENT DOCUMENTS

| | | |
|---|---|---|
| CN | 101221970 A | 7/2008 |
| CN | 103003884 A | 3/2013 |

*Primary Examiner* — Vu A Le
(74) *Attorney, Agent, or Firm* — Maschoff Brennan

(57) ABSTRACT

A device includes a memory array including a first sub-bank, a second sub-bank, a first strap cell and a data line. The first strap cell is arranged between the first sub-bank and the second sub-bank. The data line includes a first portion and a second portion. The first portion is arranged across the first sub-bank. The second portion is arranged across the second sub-bank, and is coupled to the first portion via the first strap cell.

20 Claims, 7 Drawing Sheets

Related U.S. Application Data continuation of application No. 15/153,687, filed on May 12, 2016, now Pat. No. 9,601,162.

(60) Provisional application No. 62/216,894, filed on Sep. 10, 2015.

(56) References Cited

U.S. PATENT DOCUMENTS

| | | |
|---|---|---|
| 6,657,880 B1 | 12/2003 | Callahan |
| 6,738,279 B1 | 5/2004 | Kablanian |
| 7,800,095 B2 | 9/2010 | An et al. |
| 8,953,363 B2 | 2/2015 | Shimakawa et al. |
| 2001/0046150 A1 | 11/2001 | Maayan et al. |
| 2013/0141963 A1 | 6/2013 | Liaw |
| 2015/0235675 A1 | 8/2015 | Yu et al. |

* cited by examiner

MEMORY DEVICE WITH STRAP CELLS

RELATED APPLICATIONS

The present application is a continuation Application of the U.S. application Ser. No. 15/438,567, filed Feb. 21, 2017, which is a continuation Application of the U.S. application Ser. No. 15/153,687, filed May 12, 2016, which claims priority to U.S. Provisional Application Ser. No. 62/216,894, filed Sep. 10, 2015, all of which are herein incorporated by reference.

BACKGROUND

In some approaches, a memory array utilizes logic circuits and edge cells to connect the separate memory banks to I/O circuits. Each of the memory banks is sandwiched between two edge cells. Each of the logic circuits is sandwiched between two adjacent memory banks. With such arrangement, a circuit area of such memory array is too large. Accordingly, the length of the bit lines in the memory array is increased, and the wire loading in the memory array is thus increased. As a result, the performance of the memory array is reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
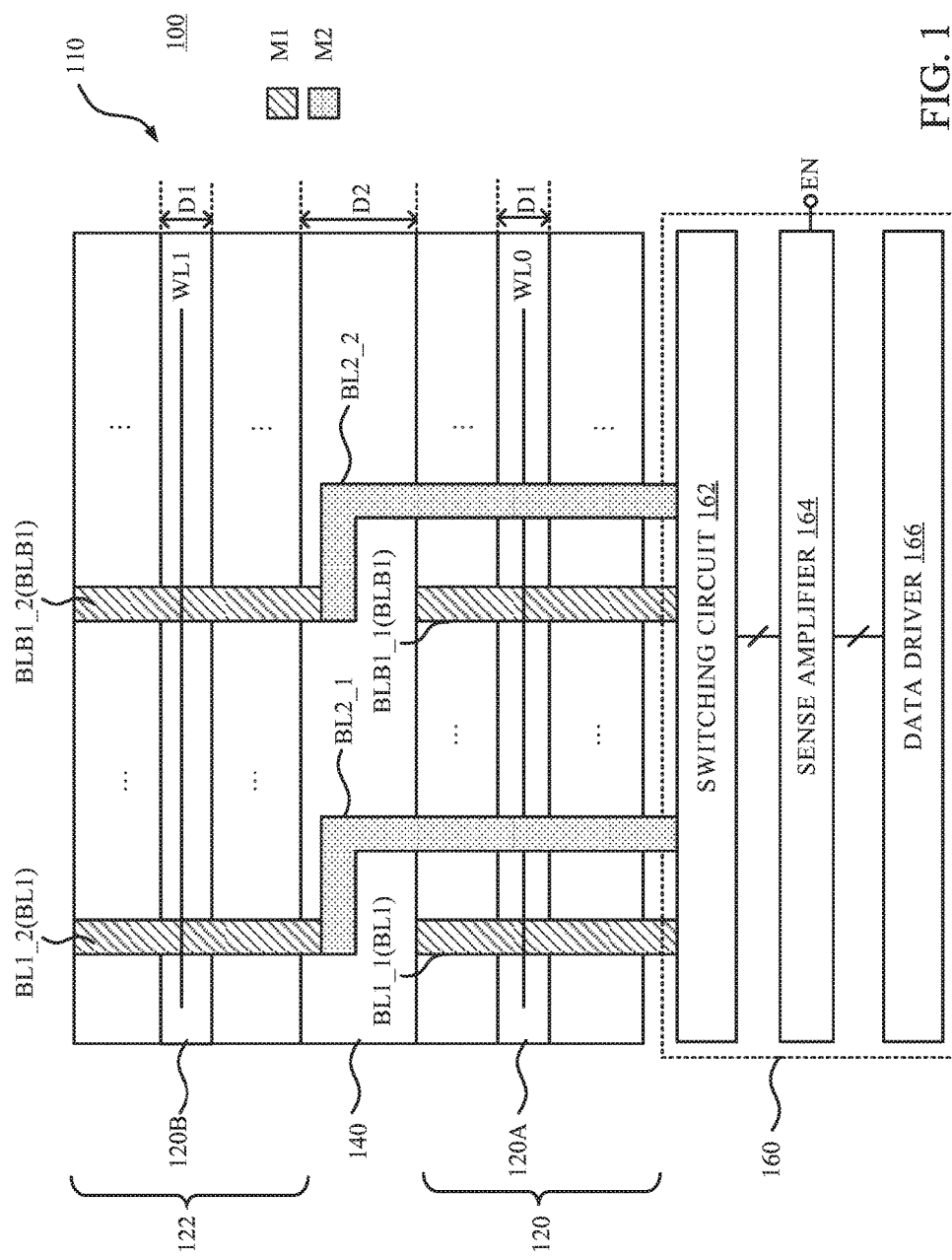
FIG. 1 is a schematic diagram of a device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a schematic diagram of a device 100, in accordance with some embodiments of the present disclosure. In some embodiments, the device 100 operates as a memory device having two or more memory banks, which include, for illustration, sub-banks 120 and 122 as shown in FIG. 1.

As illustratively shown in FIG. 1, the device 100 includes bit lines BL1, BLB1, BL2_1, and BL2_2, a memory array 110, and an input/output (I/O) circuit 160. For ease of understanding, a top view of a schematic layout of the memory array 110 is illustrated in FIG. 1. In some embodiments, the memory array 110 includes the sub-banks 120 and 122, and each of the sub-banks 120 and 122 includes rows of memory cells associated with corresponding word lines. For illustration, the sub-bank 120 includes a row of memory cells 120A associated with a corresponding word line WL0, and the sub-bank 122 includes a row of memory cells 120B associated with a corresponding word line WL1.

In some embodiments, the term "bit line" in the present disclosure is configured to be a data line in a memory array. Various configurations of the "bit line" are within the contemplated scope of the present disclosure.

For simplicity, only one row of memory cells 120A and one corresponding word line WL0 in the sub-bank 120, and only one row of memory cells 120B and one corresponding word line WL1 in the sub-bank 122, are shown in FIG. 1 for illustrative purposes. Various numbers of word lines and rows of memory cells in each one of the sub-banks 120 and 122 are within the contemplated scoped of the present disclosure.

In some embodiments, the memory array 110 further includes a strap cell 140. The strap cell 140 is arranged between the sub-banks 120 and 122 in the memory array 110. In some embodiments, the strap cell 140 is arranged to separate the bit lines BL1 and BLB1 which are both arranged across the sub-banks 120 and 122.

In some embodiments, the bit lines BL1 and BLB1 correspond to a column of memory cells (not shown) in the memory array 110, and operate with the same column of memory cells. For illustration, the bit line BL1 includes a portion BL1_1 and a portion BL1_2 which are separated by the strap cell 140, and the bit line BLB1 includes a portion BLB1_1 and a portion BLB1_2 which are also separated by the strap cell 140. The portion BL1_1 and the portion BLB1_1 correspond to a column of memory cells (not shown) in the sub-bank 120, and operate with the same column of memory cells. Correspondingly, the portion BL1_2 and the portion BLB1_2 correspond to a column of memory cells (not shown) in the sub-bank 122, and operate with the same column of memory cells.

In some embodiments, a memory cell (e.g., memory cell 440 shown in FIG. 4B) in the row of memory cells 120A is coupled to the portions BL1_1 and BLB1_1. The portions BL1_1 and BLB1_1 are utilized to couple the memory cell in the row of memory cells 120A to the I/O circuit 160. Accordingly, the memory cell in the row of memory cells 120A in the sub-bank 120 is able to be operated with the I/O circuit 160.

In some embodiments, a memory cell (e.g., memory cell 460 shown in FIG. 4B) in the row of memory cells 120B is coupled to the portions BL1_2 and BLB1_2. The portions BL1_2 and BLB1_2 are utilized to couple the memory cell in the row of memory cells 120B to the I/O circuit 160 via the bit lines BL2_1 and BL2_2. Accordingly, the memory cell in the row of memory cells 120B in the sub-bank 122 is able to be operated with the I/O circuit 160.

Figure 4A:
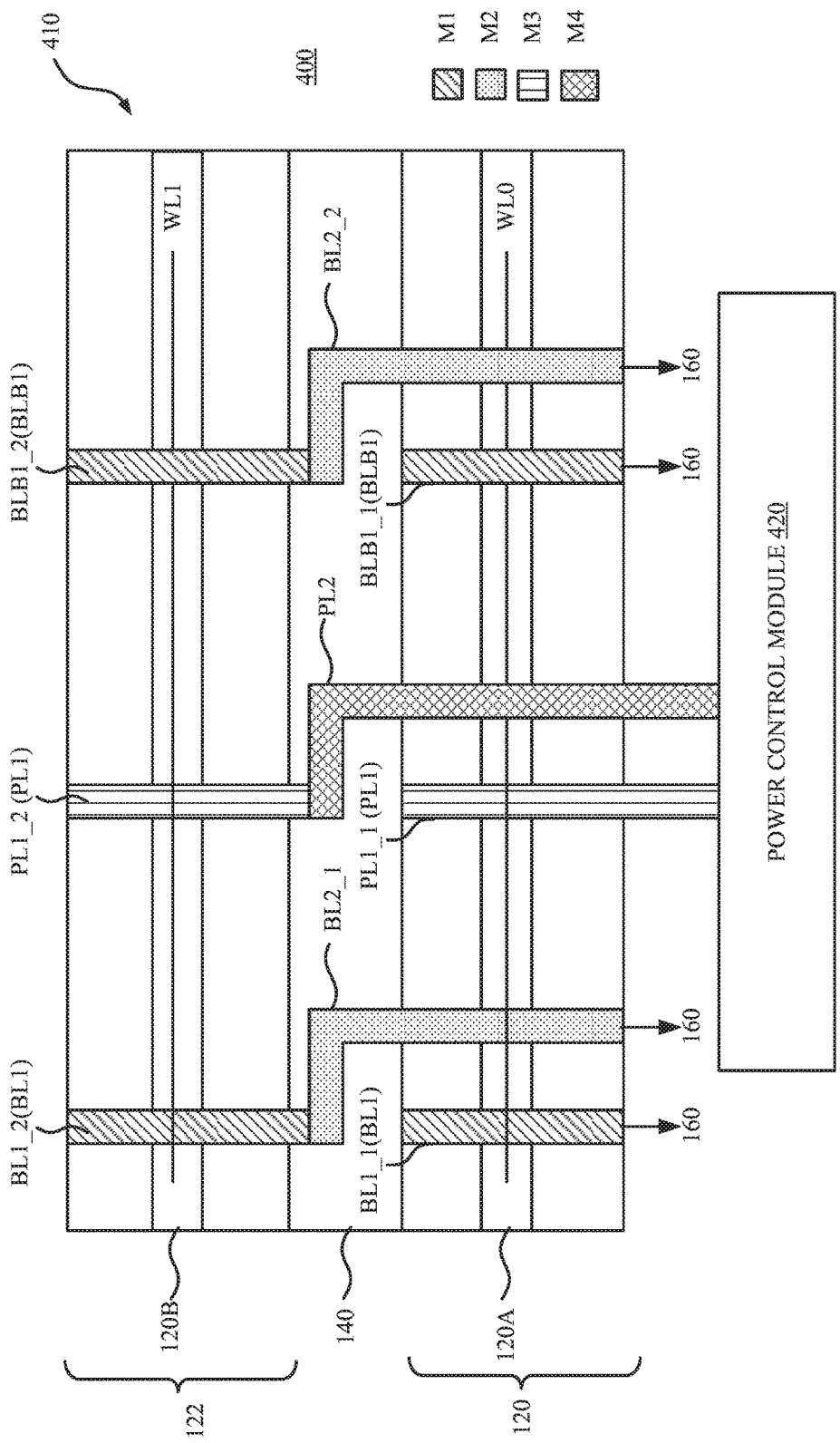
FIG. 4A is a schematic diagram of a device, in accordance with some other embodiments of the present disclosure.
Figure 4B:
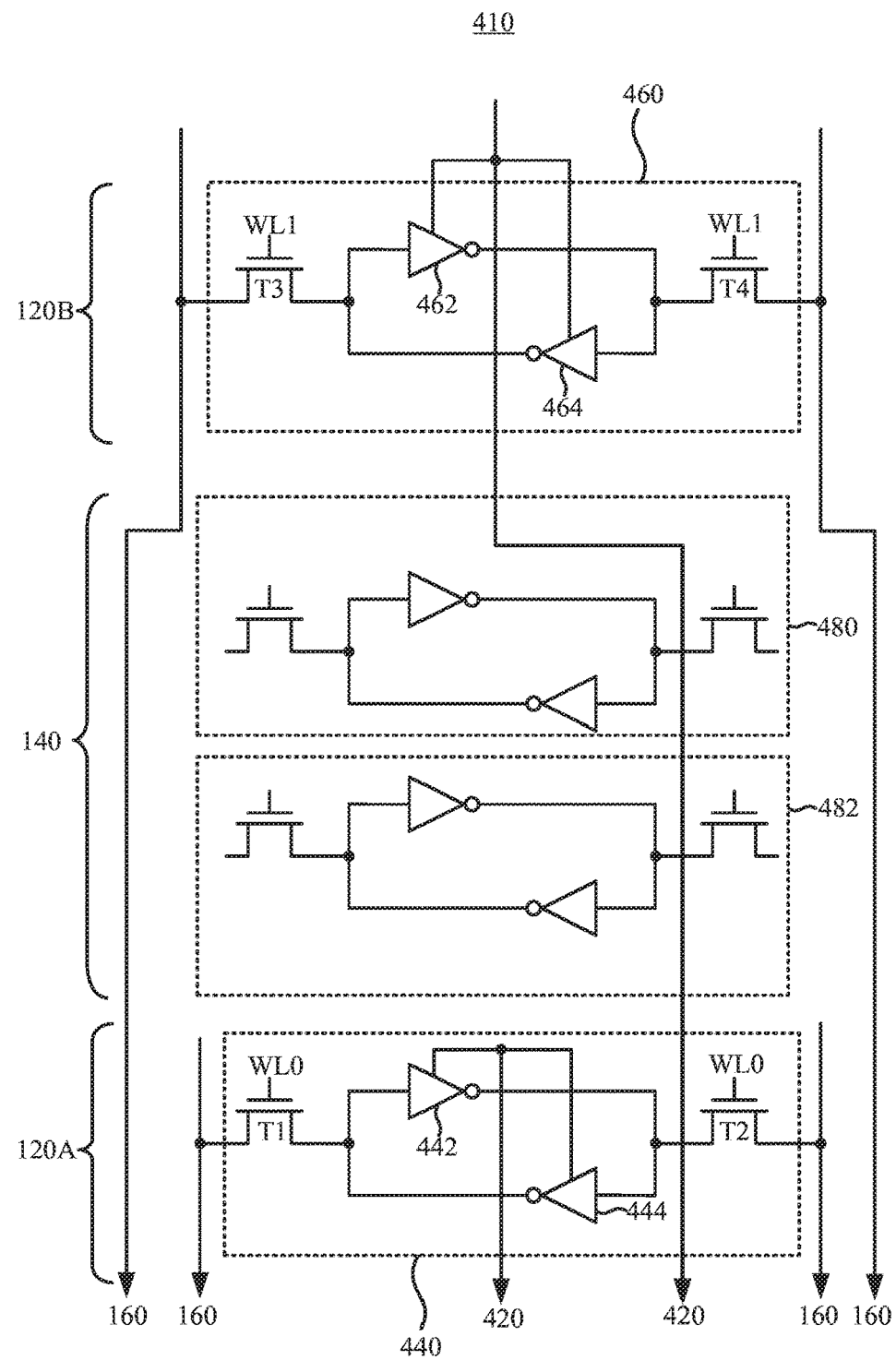
FIG. 4B is a circuit diagram of a memory array in FIG. 4A, in accordance with some other embodiments of the present disclosure.

In some embodiments, the term "memory cell" or "selected memory cell" in the present disclosure is configured as the memory cell 440 or 460 illustrated in FIG. 4B. Various configurations of the "memory cell" or "selected memory cell" are within the contemplated scope of the present disclosure.

In some embodiments, as illustrated in FIG. 1, the bit line BL2_1 is arranged above the strap cell 140, and the bit line BL2_2 is arranged above the strap cell 140. The bit line BL2_1 is coupled to the portion BL1_2 and the I/O circuit 160. The bit line BL2_2 is coupled to the portion BLB1_2 and the I/O circuit 160. Based on the arrangements of the bit lines BL2_1 and BL2_2, the memory cell in the row of memory cells 120B is coupled through the portion BL1_2 and the bit line BL2_1 to the I/O circuit 160, and is also coupled through the portion BLB1_2 and the bit line BL2_2 to the I/O circuit 160. Accordingly, the memory cell in the row of memory cells 120B in the sub-bank 122 is able to be operated with the I/O circuit 160. Effectively, the I/O circuit 160 is shared by both of the sub-banks 120 and 122.

In some embodiments, the bit lines BL1, BLB1, BL2_1, and BL2_2 are implemented with metal lines. For illustration, the bit lines BL1 and BLB1 are implemented with a first metal line formed in a metal one (M1) layer, and the bit lines BL2_1 and BL2_2 are implemented with a second metal line formed in a metal two (M2) layer. In some embodiments, the M2 layer is formed above the M1 layer.

The implementations of the bit lines BL1, BLB1, BL2_1, and BL2_2, as discussed above, are given for illustrative purposes. Various implementations of the bit lines BL1, BLB1, BL2_1, and BL2_2 are within the contemplated scope of the present disclosure.

In some embodiments, the strap cell 140 is implemented by dummy circuits of the memory cells in the sub-banks 120 and 122. In some other embodiments, the strap cell 140 is implemented by circuits other than the circuits of the memory cells. In alternative embodiments, the strap cell 140 is implemented with doped regions and/or other semiconductor structures.

The implementations of the strap cell 140 are given for illustrative purposes. Various implementations of the strap cell 140 are within the contemplated scope of the present disclosure.

In some embodiments, in a top-down sequence, the portion BL1_1 and the portion BLB1_1 are arranged in a layer separate from a layer in which the bit lines BL2_1 and BL2_2 are arranged. In some other embodiments, the portion BL1_2 and the portion BLB1_2 are arranged in a layer separate from a layer in which the bit lines BL2_1 and BL2_2 are arranged. For illustration, as discussed above, the strap cell 140 is implemented by dummy circuits of the memory cells in the sub-banks 120 and 122. In such a configuration, the portion BL1_1 and the portion BLB1_1 are arranged in a layer separate from the structure and/or a layer of the dummy circuits, and the bit lines BL2_1 and BL2_2 are arranged in a layer separate from the structure and/or the layer of the dummy circuits. In some embodiments, the portion BL1_1 is disconnected from the portion BL1_2, and the portion BLB1_1 is disconnected from the portion BLB1_2.

The arrangements of the strap cell 140 and the portions BL1_1, BL1_2, BLB1_1, and BLB1_2, discussed above, are given for illustrative purposes only. Various arrangements of the strap cell 140 and the portions BL1_1, BL1_2, BLB1_1, and BLB1_2 are within the contemplated scope of the present disclosure.

In some approaches, for a memory array, edge cells are required and arranged in separate independent memory banks, and logic circuits outside the memory banks are required and arranged to connect the memory banks with each other via the edge cells therein. As a result, the circuit size and the cost of the memory array are increased.

Compared with such approaches, the memory array 110 of the device 100 in the present disclosure includes the strap cell 140 for separating the sub-banks 120 and 122 in the memory array 110. Moreover, the bit lines BL1, BLB1, BL2_1, and BL2_2 are configured as discussed above, for different sub-banks 120 and 122 in the memory array 110 to operate with the same I/O circuit 160, without external logic circuits and edge cells. Without external logic circuits and edge cells used in related approaches, the circuit size and the cost of the device 100 are reduced.

Moreover, with the arrangements of the strap cell 140, the bit lines BL1 and BLB1 are arranged in separate segments, which include the portions BL1_1, BL1_2, BLB1_1, and BLB1_2. Effectively, compared with the bit line BL1 having a full length, the length of the portions BL1_1, BL1_2, BLB1_1, and BLB1_2 are reduced. In some embodiments, when the length of the bit line decreases, the wire loading of the bit line decreases. Thus, with the reduced length of the portions BL1_1, BL1_2, BLB1_1, and BLB1_2, the delay time of transmitting data from the sub-bank 120 and/or the sub-bank 122 to the I/O circuit 160 are reduced, and the delay time of pre-charging of the bit lines BL1, BLB1, BL2, and BLB2 are reduced as well. As a result, the efficiency of performing the read and/or write operation of the device 100 is improved.

In some embodiments, each of the row of memory cells 120A and the row of memory cells 120B has a width D1 along the longitudinal direction of the bit line BL1, and the strap cell 140 has a width D2 along the longitudinal direction of the bit line BL1. For illustration, the width D2 of the strap cell 140 is larger than the width D1. In some embodiments, the width D2 of the strap cell 140 is less than or equal to two times of the width D1. In some further embodiments, the width D2 of the strap cell 140 is less than or equal to be about four times of a poly pitch. In some embodiments, the poly pitch is a predetermined minimum distance between poly-silicon layers (not shown). In some further embodiments, the predetermined minimum distance is defined in a technology file related with the device 100.

In some embodiments, the rows of memory cells 120A and 120B are implemented by non-volatile memory cells. In some embodiments, the non-volatile memory cells include static random-access memory (SRAM) cell. For example, in some embodiments, the non-volatile memory cells include six transistors (6T) cells. In further embodiments, the non-volatile memory cells include resistive random-access memory (RRAM) cell. In some other embodiments, the non-volatile memory devices include magnetic tunnel junction (MTJ) cells. The implementations of the rows of memory cells 120A and 120B are given for illustrative purposes. Various implementations of the rows of memory cells 120A and 120B are within contemplated scope of the present disclosure.

In some embodiments, the I/O circuit 160 includes a switching circuit 162, a sense amplifier 164, and a data driver 166. The sense amplifier 164 is coupled between the switching circuit 162 and the data driver 166, as illustrated in FIG. 1.

For illustration, the switching circuit 162 is coupled to the portion BL1_1, the portion BLB1_1, and the bit lines BL2_1 and BL2_2. In some embodiments, the switching circuit 162 is configured to select one memory cell from the rows of memory cells in the sub-banks 120 and 122, in order to perform the read operation and/or the write operation. In further embodiments, during the read operation and/or the write operation, the switching circuit 162 is configured to charge the portion BL1_1 and the portion BLB1_1 that are associated with the corresponding selected memory cell, or to charge the bit lines BL2_1 and BL2_2 that are associated with the corresponding selected memory cell.

In some embodiments, the sense amplifier 164 is configured to amplify data transmitted from the selected memory cell according to an enable signal EN. The sense amplifier 164 amplifies the voltage difference, indicating a data bit, between the portion BL1_1 and the portion BLB1_1 that are associated with the corresponding selected memory cell, or between the bit lines BL2_1 and BL2_2 that are associated with the corresponding selected memory cell. Accordingly, the amplified data are able to be read properly by the data driver 166.

In some embodiments, for the read operation, the data driver 166 is further configured to latch the amplified data transmitted from the sense amplifier 164. In some embodiments, for the write operation, the data driver 166 is configured to transmit data to a corresponding selected memory cell via the portion BL1_1 and the portion BLB1_1, or via the bit lines BL2_1 and BL2_2.

The configurations of the I/O circuit 160 are given for illustrative purposes. Various configurations of the I/O circuit 160 are within the contemplated scope of the present disclosure.

The following paragraphs describe embodiments related to the device 100 to illustrate functions and applications thereof. However, the present disclosure is not limited to the following embodiments. Various arrangements that are able to implement the functions and the operations of the device 100 in FIG. 1 are within the contemplated scope of the present disclosure.

Figure 2:
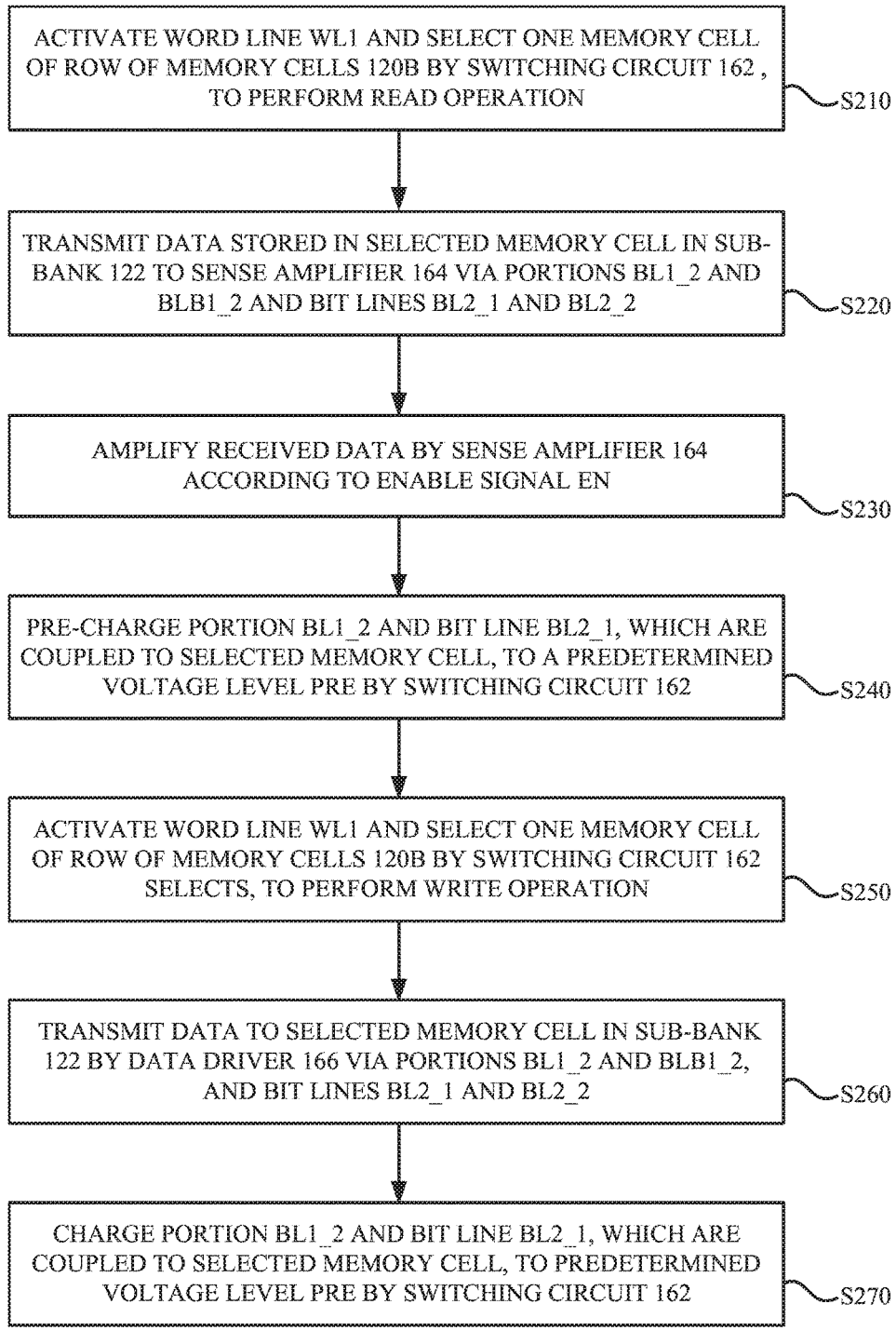
FIG. 2 is a flow chart of a method illustrating operations of the device in FIG. 1, in accordance with the some embodiments of the present disclosure.
Figure 3:
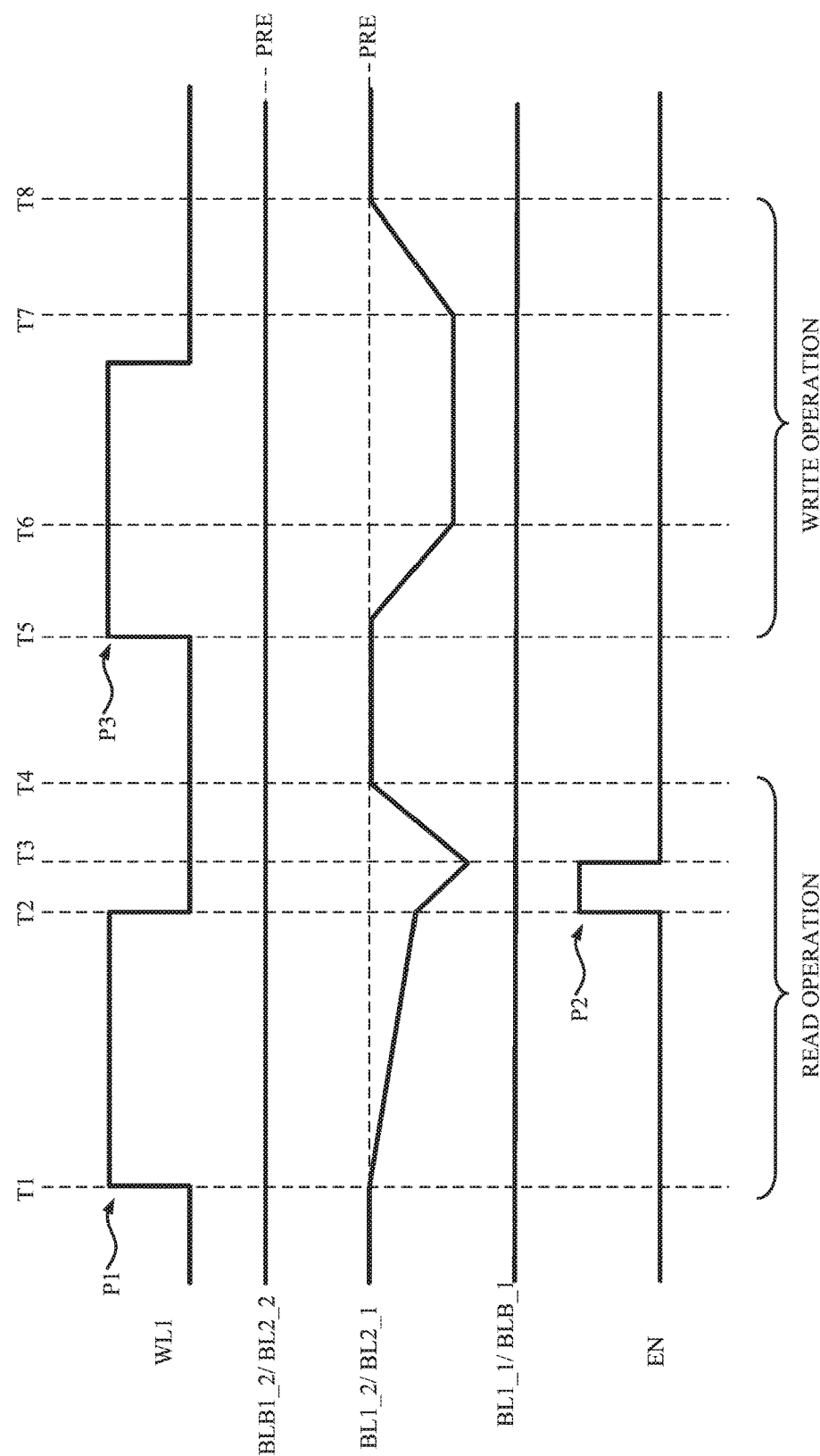
FIG. 3 is a schematic diagram of waveforms of signals applied in the device in FIG. 1, in accordance with the some embodiments of the present disclosure.

FIG. 2 is a flow chart of a method 200 illustrating operations of the device 100 in FIG. 1, in accordance with the some embodiments of the present disclosure. FIG. 3 is a schematic diagram of waveforms of signals applied in the device 100 in FIG. 1, in accordance with the some embodiments of the present disclosure. For ease of understanding, the operations of the method 200 are described with reference to FIG. 1 and FIG. 3.

In some embodiments, the method 200 includes operations S210-S270 as will be discussed below. The operations S210, S220, S230, and S240 correspond to the read operation. The operations S250, S260, and S280 correspond to the write operation.

For the read operation, in operation S210, the word line WL1 is activated, and the switching circuit 162 selects one memory cell (not shown) of the row of memory cells 120B, to perform the read operation. Given for illustrative purposes, and for simplicity, only the selected memory cell of the row of memory cells 120B in the sub-bank 122 is discussed below with reference to FIGS. 1-3. Various selected memory cells are within the contemplated scope of the present disclosure.

In operation S220, data stored in the selected memory cell in the sub-bank 122 is transmitted to the sense amplifier 164 via the portion BL1_2 and the bit line BL2_1, and via the portion BLB1_2 and the bit line BL2_2.

In operation S230, the sense amplifier 164 amplifies the received data according to the enable signal EN. For illustration, the sense amplifier 164 is enabled by the enable signal EN, and amplifies a received data signal in response to the enable signal EN.

For illustration, as shown in FIG. 3, at time T1, the voltage level of the word line WL1 in FIG. 1 is increased, and the word line WL1 is asserted to have a pulse P1. In response to the pulse P1, the word line WL1 is activated at time T1, to perform the read operation. Correspondingly, at time T1, one memory cell (not shown) of the row of memory cells 120B in the sub-bank 122 is selected by the switching circuit 162.

During a time interval between time T1 and time T2, the voltage levels of the portion BL1_2 and the bit line BL2_1 are continuously decreased, and the voltage levels of the portion BLB1_2 and the bit line BL2_2 are kept at a predetermined voltage level PRE. In some embodiments, during the time interval between time T1 and time T2, data indicating a logic value of, for example, 0, is transmitted from the selected memory cell to the sense amplifier 164.

At time T2, the enable signal EN is asserted to have a pulse P2. In response to the enable signal EN having the pulse P2, the sense amplifier 164 is enabled to amplify the received data, in order to complete the read operation, as discussed above. At that moment, the memory cells in the sub-bank 120 are not selected, and thus the voltage levels of the portions BL1_1 and BLB1_1 are kept fixed.

For illustration of FIG. 3, during a time interval between time T2 and time T3, the voltage levels of the portion BL1_2 and the bit line BL2_1 are further decreased continuously, while the voltage levels of the portion BLB1_2 and the bit line BL2_2 are kept at the predetermined voltage level PRE, as illustrated in FIG. 3.

With continued reference to FIG. 2, in operation S240, the switching circuit 162 charges the portion BL1_2 of the bit line BL1 and the bit line BL2_1, which are associated with the selected memory cell, to the predetermined voltage level PRE.

For illustration of FIG. 3, during a time interval between time T3 and time T4, the portion BL1_2 of the bit line BL1 and the bit line BL2_1 are charged by the switching circuit 162. Accordingly, the voltage levels of the portion BL1_2 of the bit line BL1 and the bit line BL2_1 are increased continuously.

At time T4, the voltage levels of the portion BL1_2 of the bit line BL1 and the bit line BL2_1 are charged to the predetermined voltage level PRE. When the portion BL1_2 and the bit line BL2_1 have the predetermined voltage level PRE, the sub-bank 122 is able to perform the subsequent operations accordingly.

With continued reference to FIG. 2, for the write operation, in operation S250, the word line WL1 is activated, and the switching circuit 162 selects one memory cell of the row of memory cells 120B, to perform the write operation.

In operation S260, the data driver 166 transmits data to the selected memory cell in the sub-bank 122 via the portion BL1_2 and the bit line BL2_1, and via the portion BLB1_2 and the bit line BL2_2.

In operation S270, after the data is written into the selected memory cell, the switching circuit 162 charges the portion BL1_2, the portion BLB1_2, and the bit lines BL2_1 and BL2_2, which are coupled to the selected memory cell, to the predetermined voltage level PRE.

For illustration of FIG. 3, at time T5, the voltage level of the word line WL1 in FIG. 1 is asserted to have a pulse P3. In response to the pulse P3, the word line WL1 is activated to perform the write operation. Correspondingly, during a time interval between time T5 and time T6, one memory cell (not shown) in the sub-bank 122 is selected by the switching circuit 162. Data indicating the logic value of 0 is then transmitted from the data driver 166 in FIG. 1 to the selected memory cell in the sub-bank 122 via the bit line BL2_1 and the bit line BL2_2, and via the portion BL1_2 and the portion BLB1_2. Accordingly, at time T5, the voltage levels of the portion BL1_2 and the bit line BL2_1, which are coupled to the selected memory cell, are decreased. The voltage levels of the portion BLB1_2 and the bit line BL2_1 are kept at the predetermined voltage level PRE. As the memory cells in the sub-bank 120 are not selected, the voltage level of the portions BL1_1 and BLB1_1 are kept fixed. After the data are written into the selected memory cell, during a time interval between time T7 and time T8, the voltage level of the portion BL1_2 and that of the bit line BL2_1, which are coupled to the selected memory cell, are charged to the predetermined voltage PRE by the switching circuit 162 in FIG. 1. Thus, the sub-bank 122 is ready to perform the subsequent operations.

The above description includes exemplary operations, but the operations of the method 200 are not necessarily performed in the order described. The order of the operations disclosed in the method 200 are able to be changed, or the operations are able to be executed simultaneously or partially simultaneously as appropriate, in accordance with the spirit and scope of various embodiments of the present disclosure.

Reference is now made to FIG. 4A. FIG. 4A is a schematic diagram of a device 400, in accordance with some other embodiments of the present disclosure.

Compared to the device 100 in FIG. 1, the device 400 in FIG. 4A includes a memory array 410, and further includes a power line PL1, a power line PL2, and a power control module 420. For ease of understanding, a top view of a schematic layout of the memory array 410 is illustrated in FIG. 4A. For illustration in FIG. 4A, the memory array 410 includes like elements corresponding to those of the memory array 110 in FIG. 1. With respect to the embodiments of FIG. 1, like elements in FIG. 4A are designated with the same reference numbers for ease of understanding.

As illustratively shown in FIG. 4A, the power line PL1 includes a portion PL1_1 and a portion PL1_2 which are separated by the strap cell 140. In other words, the portion PL1_1 of the power line PL1 is disconnected from the portion PL1_2 of the power line PL1.

For illustration, the portion PL1_1 of the power line PL1 is coupled between one memory cell (not shown) in the row of memory cells 120A and the power control module 420. The portion PL1_2 of the power line PL1 is coupled to one memory cell (not shown) in the row of memory cells 120B and the power line PL2. The power line PL2 is coupled to the power control module 420.

In some embodiments, the portion PL1_1 is arranged in a layer separate from a layer in which the power line PL2 is arranged. In some other embodiments, the portion PL1_2 is arranged in a layer separate from a layer in which the power line PL2 is arranged. For example, as discussed above, the straps 140 is able to be implemented by dummy circuits of the memory cells. In such a configuration, the portion PL1_1 and the portion PL1_2 are able to be arranged in the layer separate from the structure and/or the layer of the dummy circuits, and the power line PL2 is able to be arranged in the layer separate from the structure and/or layers of the dummy circuits. In some embodiments, the portion PL1_1 is disconnected from the portion PL1_2.

The arrangements of the strap cell 140 and the portions PL1_1 and PL1_2 and the power line PL2 are given for illustrative purposes only. Various arrangements of the strap cell 140 and the portions PL1_1 and PL1_2 and the power line PL2 are within the contemplated scope of the present disclosure.

In some embodiments, the power line PL1 and the power line PL2 are implemented with metal lines. For illustration, the power line PL1 is implemented with a third metal line formed in a metal three (M3) layer. The power line PL2 is implemented with a fourth metal line formed in a metal four (M4) layer. In some embodiments, the M4 layer is formed above the M3 layer.

The implementations of the power line PL1 and the power line PL2 are given for illustrative purposes. Various implementations of the power line PL1 and the power line PL2 are within the contemplated scope of the present disclosure.

In some embodiments, the power control module 420 includes a power converter with a digital controller. In some other embodiments, the power control module 420 is implemented with a low-dropout (LDO) regulator. The implementations of the power control module 420 are given for illustrative purposes. Various implementations of the power control module 420 are within the contemplated scope of the present disclosure.

In some embodiments, the power control module 420 is configured to supply at least one system voltage (not shown) to the memory cells in the sub-bank 120 and the memory cells in the sub-bank 122. In some embodiments, the least one system voltage is a bias voltage, a ground voltage, a precharge voltage, etc. For illustration of FIG. 4A, the power control module 420 transmits the least one system voltage to the row of memory cells 120A in the sub-bank 120 via the portion PL1_1 of the power line PL1. The power control module 420 transmits the least one system voltage to the row of memory cells 120B in the sub-bank 122 via the power line PL2 and the portion PL1_2 of the power line PL1.

With such arrangements, the power of each of the sub-banks 120 and 122 are able to be separately managed by the power control module 420. For example, when the memory cells in the sub-bank 120 enter to a data retention mode or a standby mode, the power control module 420 is able to stop supplying the least one system voltage to the sub-bank 120, or to lower the least one system voltage to the sub-bank 120. Thus, the leakage current in the unselected sub-bank 120 is able to be reduced. As a result, the active power consumption of the device 400 is saved.

For ease of understanding, the device 400 in FIG. 4A only illustrates two power lines. Various number of the power lines are within the contemplated scope of the present disclosure. Furthermore, the embodiments illustrated above are described with two sub-banks 120 and 122. Various numbers of the sub-banks are able to be applied in the device 100 in FIG. 1 and the device 400 in FIG. 4A.

Reference is now made to FIG. 4B. FIG. 4B is a circuit diagram of the memory array 410 in FIG. 4A, in accordance with some embodiments of the present disclosure. With respect to the embodiments of FIG. 4A, like elements in FIG. 4B are designated with the same reference numbers for ease of understanding.

As described above, in some embodiments, the rows of memory cells 120A and 120B includes 6T cells. For illustration of FIG. 4B, the row of memory cells 120A includes a memory cell 440. The memory cell 440 includes a switch T1, a switch T2, and inverters 442 and 444. The inverters 442 and 444 are cross-coupled with each other, to operate as a latch.

For illustration, an input terminal of the inverter 442 is coupled to an output terminal of the inverter 444. An output terminal of the inverter 442 is coupled to an input terminal of the inverter 444. The inverters 442 and 444 are configured to be biased with a system voltage, which is provided from the power control module 420 via the portion PL1_1 of the power line PL1 in FIG. 4A. The switch T1 is coupled between the portion BL1_1 in FIG. 4A and the input terminal of the inverter 442. The switch T2 is coupled between the portion BLB1_1 in FIG. 4A and the input terminal of the inverter 444. The switches T1-T2 are coupled to the word line WL0 in FIG. 4A, and are turned on when the word line WL0 is activated.

Mores, for illustration of FIG. 4B, the row of memory cells 120B includes a memory cell 460. The memory cell 460 includes a switch T3, a switch T4, and inverters 462 and 464.

For illustration, an input terminal of the inverter 462 is coupled to an output terminal of the inverter 464. An output terminal of the inverter 462 is coupled to an input terminal of the inverter 464. The inverters 462 and 464 are configured to be biased by the system voltage, which is provided from the power control module 420 in FIG. 4A via the portion PL1_2 of the power line PL1 and the power line PL2 in FIG. 4A. The switch T3 is coupled between the portion BL1_2 in FIG. 4A and the input terminal of the inverter 462. The switch T4 is coupled between the portion BLB1_2 in FIG. 4A and the input terminal of the inverter 464. The switches T3-T4 are coupled to the word line WL1 in FIG. 4A, and are turned on when the word line WL1 is activated.

As described above, in some embodiments, the strap cell 140 is implemented with dummy circuits of the sub-banks 120 and 122. For illustration of FIG. 4B, the strap cell 140 includes dummy circuits 480 and 482. The circuit configurations of the dummy circuits 480 and 482 are the same as those of the memory cells 440 and 460. For illustration, each of the dummy circuit 480 and 482 is implemented with the 6T cell. The dummy circuits 480 and 482 are disconnected from the portions BL1_1, BL1_2, BLB1_1, BLB1_2, and the portions PL1_1 and PL1_2 of the power line PL1.

For ease of understanding, the embodiments above are described with two sub-banks 120 and 122. In various embodiments, two or more sub-banks, which are able to be employed with the device 100 in FIG. 1 or the device 400 in FIG. 4A, are within the contemplated scope of the present disclosure.

Figure 5:
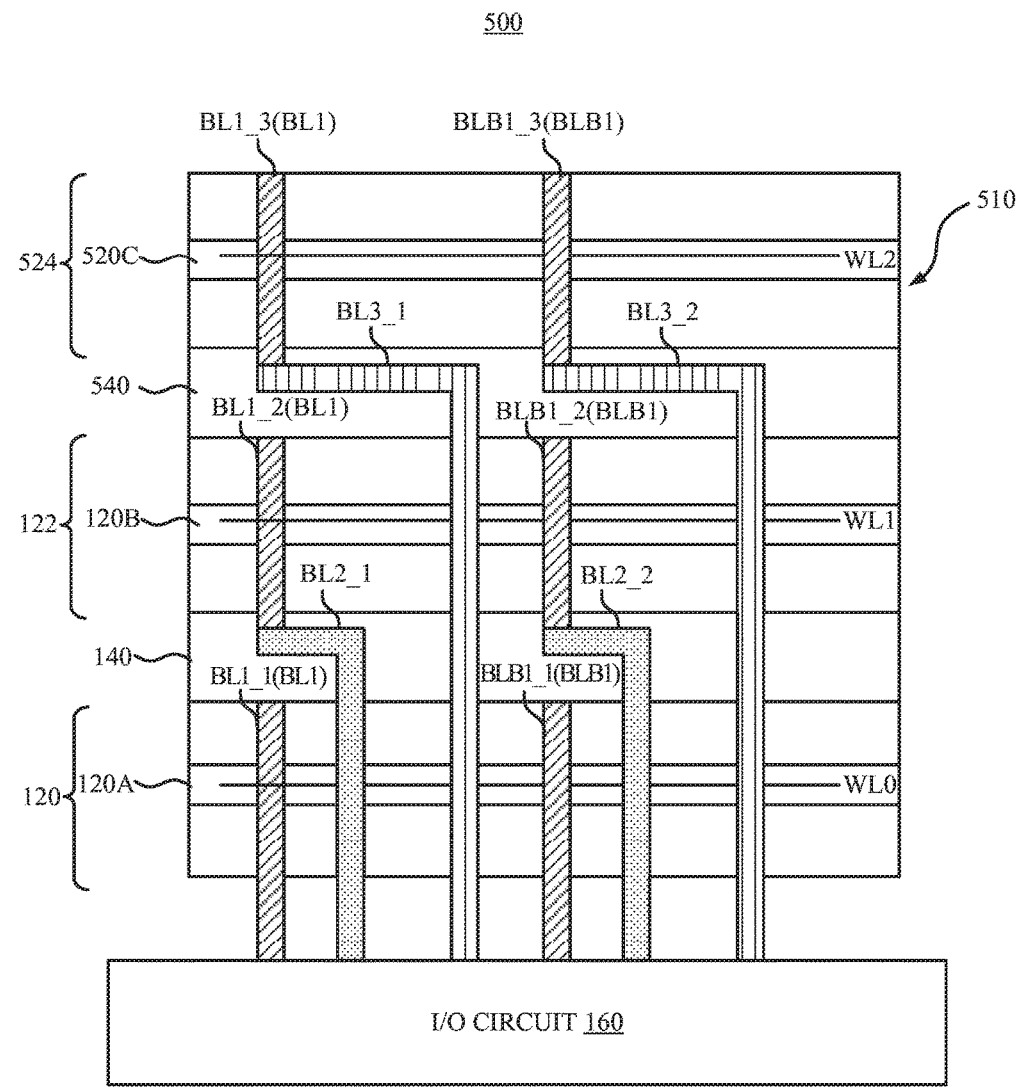
FIG. 5 is a schematic diagram of a device, in accordance with some embodiments of the present disclosure.

Reference is now made to FIG. 5. FIG. 5 is a schematic diagram of a device 500, in accordance with some embodiments of the present disclosure. With respect to the embodiments of FIG. 1, like elements in FIG. 5 are designated with the same reference numbers for ease of understanding. For ease of understanding, a top view of a schematic layout of a memory array 510 is illustrated in FIG. 5. For illustration in FIG. 5, the memory array 510 includes like elements corresponding to those of the memory array 110 in FIG. 1. With respect to the embodiments of FIG. 1, like elements in FIG. 5 are designated with the same reference numbers for ease of understanding.

For illustration, compared with the device 100 in FIG. 1, the device 500 further includes bit lines BL3_1 and BL3_2. The memory array 510 in FIG. 5 further includes a sub-bank 524 and a strap cell 540. The sub-bank 524 includes a row of memory cells 520C associated with a corresponding word line WL2.

The strap cell 540 is arranged between the sub-bank 524 and the sub-bank 122. In some embodiments, the strap cell 540 is arranged to further separate the bit lines BL1 and BLB1 which are both arranged across the sub-banks 120, 122. In some embodiments, the implementations of the strap cell 540 are similar with the implementations of the strap cell 140 in FIG. 1, as discussed above.

In the embodiments illustrated in FIG. 5, the bit line BL1 includes the portion BL1_1, the portion BL1_2, and the portion BL1_3, in which the portion BL1_2 and the portion BL1_3 are separated by the strap cell 540. In the embodiments illustrated in FIG. 5, the bit line BLB1 includes the portion BLB1_1, the portion BLB1_2, and the portion BLB1_3, in which the portion BLB1_2 and the portion BLB1_3 are separated by the strap cell 540. The portion BL1_3 and the portion BLB1_3 correspond to a column of memory cells (not shown) in the memory array 510, and operate with the same column of memory cells.

In some embodiments, a memory cell (e.g., memory cell 440 shown in FIG. 4B) in the row of memory cells 520C is coupled to the portions BL1_3 and BLB1_3. The portions BL1_3 and BLB1_3 are utilized to couple the memory cell in the row of memory cells 520C to the I/O circuit 160, via the bit lines BL3_1 and BLB3_3. Accordingly, the memory cell in the row of memory cells 520C in the sub-bank 524 is able to be operated with the I/O circuit 160. Based on the arrangements of the bit lines BL3_1 and BL3_2, the memory cell (not shown) in the row of memory cells 520C is able to operate with the I/O circuit 160. Accordingly, the I/O circuit 160 is shared by the sub-banks 120, 122 and 524. With this analogy, various numbers of the sub-banks are able to be merged as a single memory array.

In some embodiments, in a top-down sequence, the portion BL1_3 and the portion BLB1_3 are arranged in a layer separate from a layer in which the bit lines BL3_1 and BL3_2 are arranged. In some other embodiments, the portions BL1_2 and BLB1_2 are arranged in a layer separate from a layer in which the bit lines BL3_1 and BL3_2 are arranged. For example, similar to the strap cell 140 in FIG. 1, the strap cell 540 is also able to be implemented by dummy circuits of the memory cells in some embodiments. In such a configuration, the portion BL1_3 and the portion BLB1_3 are able to be arranged in the layer separate from the structure and/or the layer of the dummy circuits, and the bit lines BL3_1 and BL3_2 are able to be arranged in the layer separate from the structure and/or the layer of the dummy circuits. Based on the arrangements illustrated in FIG. 5, the portion BL1_1, the portion BL1_2, and the portion BL1_3 are disconnected from each other via the strap cells 140 and 540. The portions BLB1_1, the BLB1_2, and the BLB1_3 are disconnected from each other via the strap cells 140 and 540.

In some embodiments, the bit lines BL1, the bit lines BL2_1 and BL2_2, and the bit lines BL3_1 and BL3_2 are implemented with different metal lines. For illustration, the bit lines BL3_1 and BL3_2 are implemented with a metal line formed in the M3 layer as discussed above. In some embodiments, the M3 layer is arranged above both of the strap cell 140 and the strap cell 540. The implementations of the bit lines BL3_1 and BL3_2 are given for illustrative purposes. Various implementations of the bit lines BL3_1 and BL3_2 are within the contemplated scope of the present disclosure.

Figure 6:
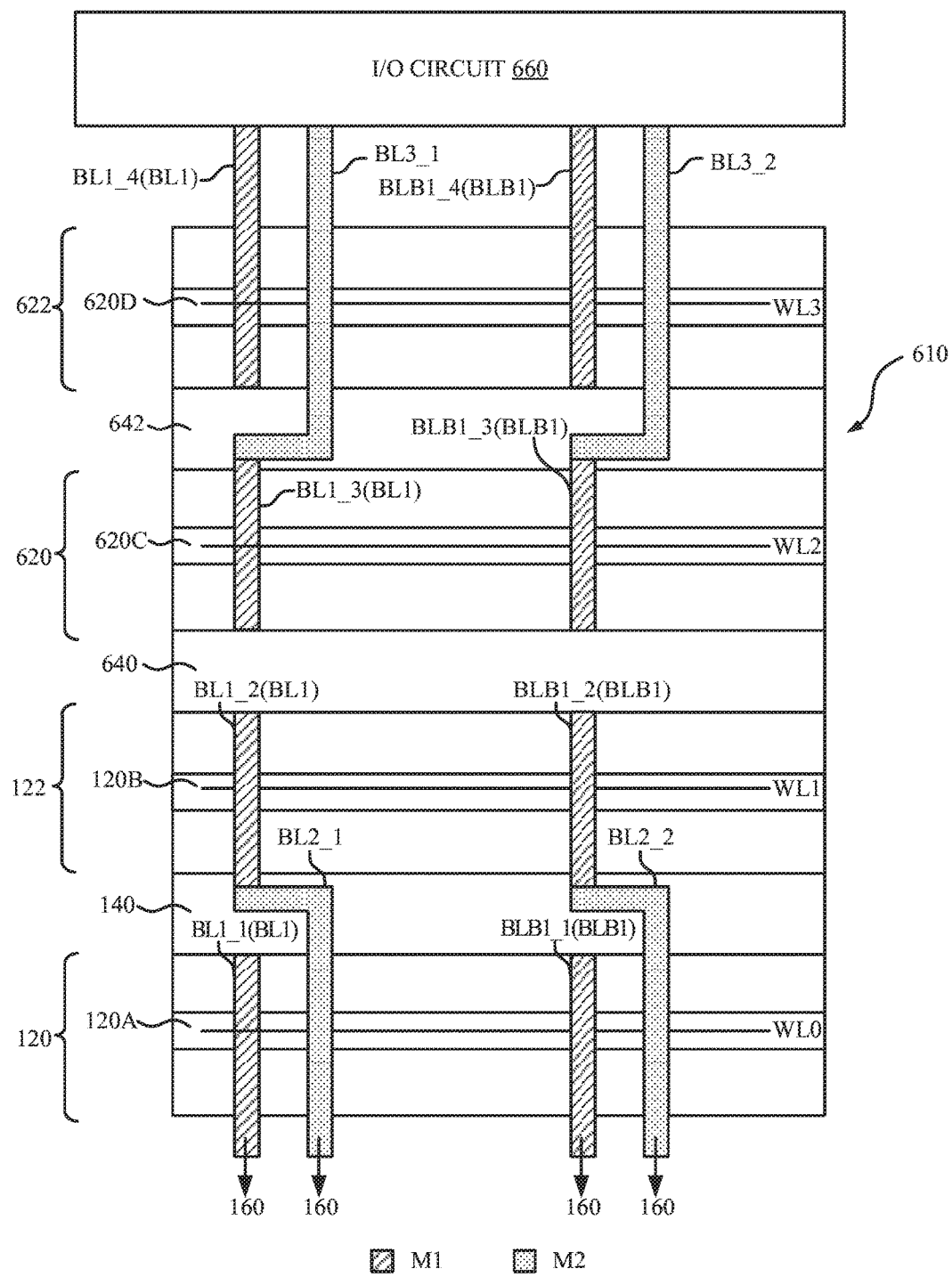
FIG. 6 is a schematic diagram of a device, in accordance with some alternative embodiments of the present disclosure.

Reference is now made to FIG. 6. FIG. 6 is a schematic diagram of a device 600, in accordance with some alternative embodiments of the present disclosure. For ease of understanding, a top view of a schematic layout of a memory array 610 is illustrated in FIG. 6. For illustration in FIG. 6, the memory array 610 includes like elements corresponding to those of the memory array 110 in FIG. 1. With respect to the embodiments of FIG. 1, like elements in FIG. 6 are designated with the same reference numbers for ease of understanding.

Compared with the device 100 in FIG. 1, the device 600 in FIG. 6 further includes a memory array 610, bit lines BL3_1 and BL3_2, and an I/O circuit 660. The memory array 610 further includes sub-banks 620 and 622. The sub-bank 620 includes a row of memory cells 620C associated with a corresponding word line WL2. The sub-bank 622 includes a row of memory cells 620D associated with a corresponding word line WL3.

In some embodiments, the memory array 610 further includes a strap cell 640 and a strap cell 642. For illustration, the strap cell 640 is arranged to separate the bit lines BL1 and BLB1 which are both arranged across the sub-bank 620 and the sub-bank 122. The strap cell 642 is arranged to separate the bit lines BL1 and BLB1 which are both arranged across the sub-bank 620 and the sub-bank 622. In some embodiments, the implementations of the strap cell 640 and 642 are similar with the implementations of the strap cell 140 in FIG. 1, as discussed above.

In the embodiments illustrated in FIG. 6, the bit lines BL1 and BLB1 correspond to a column of memory cells (not shown) in the memory array 610, and operate with the same column of memory cells. For illustration, the bit line BL1 includes portions BL1_1, BL1_2, BL1_3, and BL1_4. The portion BL1_2 and the portion BL1_3 are separated by the strap cell 640. The portion BL1_3 and BL1_4 are separated by the strap cell 642. The bit line BLB1 includes the portions BLB1_1, BLB1_2, BLB1_3, and BLB1_4. The portion BLB1_2 and the portion BLB1_3 are separated by the strap cell 640. The portion BLB1_3 and BLB1_4 are separated by the strap cell 642. The portion BL1_3 and the portion BLB1_3 correspond to a column of memory cells (not shown) in the sub-bank 620, and operate with the same column of memory cells. Correspondingly, the portion BL1_4 and the portion BLB1_4 correspond to a column of memory cells (not shown) in the sub-bank 622, and operate with the same column of memory cells. In some embodiments, in a top-down sequence, the portions BL1_3 and BLB1_3 are arranged in a layer separate from a layer in which the bit lines BL3_1 and BL3_2 are arranged. In some other embodiments, the portions BL1_4 and BLB1_4 are arranged in a layer separate from a layer in which the bit lines BL3_1 and BL3_2 are arranged. For illustration, similar to the strap cell 140 in FIG. 1, the strap cell 640 is implemented by dummy circuits of the memory cells. The portions BL1_3, BLB1_3, BL1_4, and BLB1_4 are able to be arranged in the layer separate from the structure and/or layer of the dummy circuits, and the bit lines BL3_1 and BL3_2 are arranged in the layer separate from the structure and/or the layer of the dummy circuits. Based on the arrangements illustrated in FIG. 6, the portions BL1_1-BL1_4 are disconnected from each other via the strap cells 140, 640, and 642. The portions BLB1_1-BLB1_4 are disconnected from each other via the strap cells 140, 640, and 642.

The arrangements of the portions BL1_3, BLB1_3, BL1_4, BLB1_4, and the bit lines BL3_1 and BL3_2, discussed above, are given for illustrative purposes only. Various arrangements of the portions discussed above are within the contemplated scope of the present disclosure.

In some embodiments, a memory cell (e.g., memory cell 440 shown in FIG. 4B) in the row of memory cells 620C is coupled to the portions BL1_3 and BLB1_3. The portions BL1_3 and BLB1_3 are utilized to couple the memory cell in the row of memory cells 620C to the I/O circuit 660, via the bit line BL3_1 and BLB3_2. Accordingly, the memory cell in the row of memory cells 620C in the sub-bank 620 is able to be operated with the I/O circuit 660.

In some embodiments, a memory cell (e.g., memory cell 440 shown in FIG. 4B) in the row of memory cells 620D is coupled to the portions BL1_4 and BLB1_4. The portions BL1_4 and BLB1_4 are utilized to couple the memory cell in the row of memory cells 620D to the I/O circuit 660. Accordingly, the memory cell in the row of memory cells 620D in the sub-bank 640 is able to be operated with the I/O circuit 660.

The functions and implementations of the I/O circuit 660 are similar to the I/O circuit 160 illustrated in FIG. 1. Thus, the detailed descriptions are not given here.

As described above, in some embodiments, the bit line BL1, BLB1, BL2_1, BL2_2, BL3_1, and BL3_2 are implemented with different metal lines. For illustration, the bit lines BL1 and BLB1 are implemented with the first metal lines formed in the M1 layer as discussed above. The bit lines BL2_1, BL2_2, BL3_1, and BL3_2 are implemented with the second metal lines that are formed in the M2 layer as discussed above. In some embodiments, the M2 layer is formed above the M1 layer.

In some further embodiments, similar to the embodiments illustrated in FIG. 4A above, the strap cell 640 is further configured to separate a power line (not shown) into multiple portions. The arrangements of the power line are similar with the embodiments illustrated in FIG. 4A. Thus, the repetitious descriptions are not given here. With such arrangements, the power of each of the sub-banks 120, 122, 640, and 642 are able to be separately managed by the power control module 420 in FIG. 4A. As described above, with such power management, the active power consumption of the device 600 is able to be saved.

As described above, the devices provided in the present disclosure are able to reduce the wire loading of the bit lines. Accordingly, the timing impacts, including, for example, additional time delays, are able to be reduced. As a result, the performance of the memory array employing such arrangements is improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device that includes a memory array is disclosed. The memory array includes a first sub-bank, a second sub-bank, a first strap cell and a data line. The first strap cell is arranged between the first sub-bank and the second sub-bank. The data line includes a first portion and a second portion. The first portion is arranged across the first sub-bank. The second portion is arranged across the second sub-bank, and is coupled to the first portion via the first strap cell.

Also disclosed is a device that includes a first strap cell, and a power line. The first strap cell is arranged between a first memory cell in a first sub-bank and a second memory cell in a second sub-bank, in a memory array. The power line is arranged across the first strap cell, and includes a first portion and a second portion that is coupled to the first portion, wherein the second portion of the power line is configured to transmit at least one system voltage through the first portion to the first memory cell.

Also disclosed is a method including operations below. First data stored in a first sub-bank of a memory array is transmitted via a data line including a first portion and a second portion that is coupled to the first portion and is arranged across a first strap cell that is arranged to separate the first sub-bank and a second sub-bank of the memory array, to an input/output (I/O) circuit. The first portion and the second portion of the data line are implemented in separate conductive layers which are different from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a memory array including
a first sub-bank,
a second sub-bank,
a power line, wherein a first portion of the power line is coupled to the first sub-bank,
a first strap cell arranged between the first sub-bank and the second sub-bank, and
a continuous data line comprising a first portion and a second portion,
wherein
the first portion is arranged across the first sub-bank, and
the second portion is arranged across the second sub-bank, and is coupled to the first portion via the first strap cell.

2. The device of claim 1, wherein the first portion and second portion of the data line are implemented in separate conductive layers which are different from each other.

3. The device of claim 1, wherein
the first portion of the continuous data line is coupled to a first memory cell in the first sub-bank, and
the second portion of the continuous data line is coupled to a second memory cell in the second sub-bank.

4. The device of claim 1, wherein
the first portion of the power line is coupled to a row of memory cells in the first sub-bank, and
a second portion of the power line is coupled between the first portion of the power line and a power control module.

5. The device of claim 4, wherein the first portion and the second portion of the power line are implemented in separate conductive layers which are different from each other.

6. The device of claim 1, wherein the first sub-bank comprises a first row of memory cells, the second sub-bank comprises a second row of memory cells,
the first row of memory cells and the second row of memory cells have a first width, and a width of the first strap cell is less than or equal to about two times of the first width.

7. The device of claim 1, wherein a width of the first strap cell is less than or equal to about four times of a poly pitch.

8. The device of claim 1, wherein the memory array further comprises:
a second strap cell arranged between the second sub-bank and a third sub-bank of the memory array; and
a second data line, wherein the second data line is arranged across the first sub-bank and the second sub-bank, and is coupled to a third portion of the data line via the second strap cell.

9. The device of claim 1, wherein the memory array further comprises:
a second strap cell arranged between the second sub-bank and a third sub-bank of the memory array; and
a third strap cell arranged between the third sub-bank and a fourth sub-bank of the memory array; and
a second data line, wherein the second data line is arranged across the fourth sub-bank, and is coupled to a third portion of the data line via the second strap cell,
wherein the second portion of the data line is further coupled to a first input/output (I/O) circuit, and the second data line is further coupled to a second I/O circuit.

10. A device, comprising:
a first strap cell arranged between a first memory cell in a first sub-bank and a second memory cell in a second sub-bank, in a memory array; and
a power line arranged across the first strap cell and comprising a first portion and a second portion that is coupled to the first portion, wherein the second portion of the power line is configured to transmit at least one system voltage through the first portion to the first memory cell.

11. The device of claim 10, further comprising:
a first data line, wherein a first portion of the first data line is coupled to a memory cell in a first row of memory cells in the memory array, and a second portion of the first data line is coupled between a first input/output (I/O) circuit and a memory cell in a second row of memory cells in the memory array; and
a second data line coupled between the first portion of the first data line and the first I/O circuit.

12. The device of claim 11, wherein the first data line, the second data line, and the power line are implemented in separate conductive layers which are different from each other.

13. The device of claim 11, further comprising:
a second strap cell arranged between the first row of memory cells and a third row of memory cells in the memory array, wherein a third portion of the first data line is coupled to a memory cell in the third row of memory cells; and
a third data line coupled between the first I/O circuit and the third portion of the first data line.

14. The device of claim 11, further comprising:
a second strap cell arranged between the first row of memory cells and a third row of memory cells in the memory array, wherein a third portion of the first data line is coupled to a memory cell in the third row of memory cells;

a third strap cell arranged between the third row of memory cells and a fourth row of memory cells in the memory array, wherein a fourth portion of the first data line is coupled between a memory cell in the fourth row of memory cells and a second input/output (I/O) circuit; and a third data line coupled between the second I/O circuit and the third portion of the first data line.

15. The device of claim 10, wherein a width of the first strap cell is less than or equal to about two times of a first width of a first row of memory cells or a second row of memory cells in the memory array.

16. The device of claim 10, wherein a width of the first strap cell is less than or equal to about 4 times of a poly pitch.

17. A method, comprising:

transmitting first data stored in a first sub-bank of a memory array, via a continuous data line comprising a first portion and a second portion that is coupled to the first portion and is arranged across a first strap cell that is arranged to separate the first sub-bank and a second sub-bank of the memory array, to an input/output (I/O) circuit, and selectively transmitting at least one system voltage to the first sub-bank via a first portion of a power line that includes the first portion and a second portion, wherein the first portion and the second portion of the data line are implemented in separate conductive layers which are different from each other.

18. The method of claim 17, wherein the first portion and the second portion of the power line are implemented in separate conductive layers which are different from each other.

19. The method of claim 18, further comprising:

stopping transmitting the at least one system voltage to the first sub-bank on condition that memory cells in the first sub-bank enter a data retention mode or a standby mode.

20. The method of claim 17, further comprising:

transmitting second data from a data driver of the I/O circuit to the first sub-bank via the continuous data line.

* * * * *